United States Patent [19]
Daems et al.

[11] Patent Number: 5,882,840
[45] Date of Patent: Mar. 16, 1999

[54] PHOTOSENSITIVE ELEMENT COMPRISING AN IMAGE FORMING LAYER AND A PHOTOPOLYMERISABLE LAYER

[75] Inventors: Eddie Daems; Luc Leenders, both of Herentals, Belgium

[73] Assignee: Agfa-Gevaert, Mortsel, Belgium

[21] Appl. No.: 706,241

[22] Filed: Sep. 4, 1996

[30] Foreign Application Priority Data

Sep. 5, 1995 [EP] European Pat. Off. ............. 95202398

[51] Int. Cl.$^6$ ..................................... G03C 1/90
[52] U.S. Cl. ........................................... 430/258; 430/306
[58] Field of Search .................................. 430/254, 256, 430/306

[56] References Cited

U.S. PATENT DOCUMENTS

| | | |
|---|---|---|
| 4,081,282 | 3/1978 | Merrill et al. ............................... 96/17 |
| 4,751,167 | 6/1988 | Yamagata et al. ...................... 430/263 |

FOREIGN PATENT DOCUMENTS

| | | |
|---|---|---|
| A2716422 | 3/1977 | Germany . |
| A1532307 | 11/1978 | United Kingdom . |

OTHER PUBLICATIONS

Patent Abstracts of Japan, vol. 003, No. 150 (E–158), Dec. 11, 1979 and JP–A–54 130120 (Fuji Photo Film Co., Ltd.), Oct. 9, 1979.

Patent Abstracts of Japan, vol. 009, No. 064 (P–343), Mar. 23, 1985 and JP–A–59 198445 (Kimoto:KK), Nov. 10, 1984.

Research Disclosure, No. 222, Oct. 1982, Havant GB, pp. 328–329, D. D'Hont et al., "Photodelamination Imaging Disclosure Nr 22202".

Patent Abstracts of Japan, vol. 009, No. 090 (P–350), Apr. 19, 1985 and JP–A–59 218446 (Mita Kogyo KK), Dec. 8, 1984.

*Primary Examiner*—John Goodrow
*Attorney, Agent, or Firm*—Baker & Botts, L.L.P.

[57] ABSTRACT

A photosensitive element, and a process for forming a high density photo mode image with it, is disclosed comprising a support, an image forming layer comprising an image forming substance, preferably carbon black, a photopolymerisable layer and a cover sheet. Optionally a release layer can be present between the image forming layer and the photopolymerisable layer.

26 Claims, 2 Drawing Sheets

FIG. 1

FIG. 2

PHOTOSENSITIVE ELEMENT COMPRISING AN IMAGE FORMING LAYER AND A PHOTOPOLYMERISABLE LAYER

DESCRIPTION

1. Field of the Invention

The present invention relates to a method for the formation of a photo mode image.

2. Background of the Invention

Conventional photographic materials based on silver halide are used for a large variety of applications. For instance, in the prepress sector of graphic arts rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Other fields include materials for medical recording, duplicating and hard copy, X-ray materials for non-destructive testing, black-and-white and colour materials for amateur- and professional still photography and materials for cinematographic recording and printing.

Silver halide materials have the advantage of high potential intrinsic sensitivity and excellent image quality. On the other hand they show the drawback of requiring several wet processing steps employing chemical ingredients which are suspect from an ecological point of view. As a consequence it is undesirable that depleted processing solutions would be discharged into the public sewerage; they have to be collected and destroyed by combustion, a cumbersome and expensive process.

In the past several proposals have been made for obtaining an image that can be formed using only dry development steps without the need of processing liquids as it is the case with silver halide photographic materials.

A dry imaging system known since quite a while is 3M's dry silver technology. It is a catalytic process which couples the light-capturing capability of silver halide to the image-forming capability of organic silver salts.

As a further alternative for conventional silver halide chemistry dry imaging elements are known that can be image-wise exposed using an image-wise distribution of heat. These types of dry imaging elements called heat mode materials (or thermal imaging materials, thermal recording materials or thermographic materials) offer the advantage in addition to an ecological advantage that they do not need to be handled in a dark room nor any other protection from ambient light is needed. Heat mode recording materials, based on change of adhesion, are disclosed in e.g. U.S. Pat. No. 4,123,309, U.S. Pat. No. 4,123,578, U.S. Pat. No. 4,157,412, U.S. Pat. No. 4,547,456 and PCT applications WO 88/04237 and WO 93/03928.

In still another type of heat mode recording materials information is recorded by creating differences in reflection and/or transmission in the recording layer. The recording layer has high optical density. The conversion of radiation into heat brings about a local temperature rise, causing a change such as evaporation or ablation to take place in the recording layer. As a result, the irradiated parts of the recording layer are totally or partially removed, and a difference in optical density is formed between the irradiated parts and the unirradiated parts (cf. U.S. Pat. Nos. 4,216,501, 4,233,626, 4,188,214 and 4,291,119 and British Pat. No. 2,026,346). In a preferred embodiment the recording layer of such heat mode recording materials is made of a metal, e.g. bismuth.

Still another type of non-conventional materials as alternative for silver halide is constituted by so-called photo mode materials based on photopolymerisation. The use of photopolymerizable compositions for the production of images by information-wise exposure thereof to actinic radiation is known since quite a while. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc.. Some of the thus produced differences may be subsequently employed in a dry treatment step to produce a visible image and/or master for printing e.g. a lithographic or electrostatic printing master.

The problem arises that for direct visual inspection the obtained densities in the exposed areas tend to be too low.

In U.S. Pat. No. 4,288,525 a photosensitive material is described comprising a first carrier sheet, a photosensitive layer, an image forming layer and a second carrier sheet, the bond between said second carrier sheet and said image forming layer prior to exposure being stronger than the bond between said photosensitive layer and said first carrier sheet and, following exposure the bond between said photosensitive layer and said first carrier sheet in the exposed areas being stronger than the bond between said image forming layer and said second carrier sheet, and the exposed portion of said photosensitive layer and at least part of said image forming layer in contact with said exposed portion of said photosensitive layer are removable along with said first carrier sheet on separating said first and second sheet after imagewise exposure. In the unexposed areas the image forming and the integral photosensitive layer adhere to said second carrier sheet.

Practical embodiments of the materials of U.S. Pat. No. 4,288,525 show several drawbacks. On top of the positive image the non-polymerised photosensitive layer is integrally present. This means that this layer will exert an unwanted spacer activity when the positive image is meant to serve as a master for the exposure of a printing plate or another intermediate photographic material. Moreover, as it is clear from FIG. 1, the possibility exists for a cohesive rupture of the image forming layer. In this case the positive image is unusable (too high Dmin) and the negative image is unprotected against physical damage.

The present invention extends the teachings on photosensitive layers comprising also an image forming layer.

It is an object of the present invention to provide an unconventional image forming material, based on photo mode, which constitutes an alternative to conventional image-setting films and contact films based on silver halide.

It is a further object of the present invention to provide a process for the formation of a positive image which is protected against physical damage, shows a low Dmin and reduced spacer activity.

Further objects will become apparent from the description hereinafter.

3. SUMMARY OF THE INVENTION

The objects of the present invention are realized by providing a process for the formation of a photo mode image comprising the following steps:

(A) exposing information-wise to actinic radiation a photosensitive element comprising, in order,:

a support optionally provided with a subbing layer, an image forming layer comprising an image forming substance, a photosensitive layer comprising a free radical polymerisable monomer having at least two ethylenically unsaturated groups, a binder, a photoinitiator and optionally a sensitizer, wherein the ratio of the amount by weight of monomer to the amount by weight of binder is comprised between 0.5 and 4.0, a transparent cover sheet, and, in which, when said material has not yet been exposed to actinic radiation, the cohesive strength of said photosensitive layer is lower than both the adhesive strength between said image forming layer and said support or its subbing layer when present, and the adhesive strength between said photosensitive layer and said cover sheet, whereas, upon exposure to actinic radiation through said cover sheet, the cohesive strength of said photopolymerised photosensitive layer and the adhesive strenght of said photopolymerised photosensitive layer to said image forming layer both become higher than the adhesive strenght between said image forming layer and said support or its subbing layer when present.

(B) peeling apart said support and said cover sheet whereby, in the unexposed areas, said image forming layer and part of the cohesively broken photosensitive layer adhere to said support or its subbing layer when present thus forming a positive image, whereas in the exposed areas the photopolymerised photosensitive layer and the image forming layer adhere to the cover sheet thus forming a negative image.

In a preferred embodiment this process further comprises a step (C) being an overall curing by means of UV or visible light of the parts of the cohesively broken photosensitive layer present on top of said positive image.

In an alternative process the above mentioned relationships concerning cohesive strenght versus adhesive strength are nor required when a release layer is present between the photosensitive layer and the image forming layer.

4. DETAILED DESCRIPTION OF THE INVENTION

First the particular features and ingredients of the photosensitive element for use in the present invention will now be explained in detail hereinafter.

Suitable transparent supports include e.g. cellulose nitrate film, cellulose acetate film, poly(vinyl acetal) film, polystyrene film, poly(ethylene terephthalate) film, polycarbonate film, polyvinylchloride film or poly-α-olefin films such as polyethylene or polypropylene film. The thickness of such organic resin film is preferably comprised between 0.025 and 0.25 mm. Suitable opaque supports include paper, e.g. resin coated paper.

In a most preferred embodiment the support is a polyethylene terephthalate support, optionally provided with a subbing layer. An example of a suitable subbing layer is a layer containing a polymer containing covalently bound chlorine. Suitable chlorine containing polymers are e.g. polyvinyl chloride, polyvinylidene chloride, a copolymer of vinylidene chloride, an acrylic ester and itaconic acid, a copolymer of vinyl chloride and vinylidene chloride, a copolymer of vinyl chloride, vinylidene chloride and itaconic acid, a copolymer of vinyl chloride, vinyl acetate and vinyl alcohol, A preferred chlorine containing polymer is co(vinylidenechloride-methylacrylate-itaconic acid; 88%/10%:2%). A most suitable subbing layer contains the latter polymer and a colloidal silica such as KIESELSOL 100F (Bayer AG). Optionally to this composition can be added co(methylacrylate-butadiene-itaconic acid) (49/49/2), preferably in a ratio of about 10%. The most favourable adhesion properties are obtained when a subbing layer as described above provided with an additional primer layer containing gelatin (preferably 0.25–0.35 g/m$^2$), Kieselsol 300 F (0.30–0.40 g/m$^2$) and a matting agent on the base of polymethylmethacrylate (average size 2 à 3 μm) at a coverage of about 0.001 g/m$^2$.

In the image forming layer the image forming substance is preferably a pigment, e.g. a magnetic pigment, e.g. iron oxides, a coloured piment, e.g. copper phtalocyanine, or metal particles. However, the most preferred pigment is carbon black. It can be used in the amorphous or in the graphite form. The preferred average particle size of the carbon black ranges from 0.01 to 1 μm. Different commercial types of carbon black can be used, preferably with a very fine average particle size, e.g. RAVEN 5000 ULTRA II (Columbian Carbon Co.), CORAX L6, FARBRUSS FW 2000, SPEZIALSCHWARZ 5, SPEZIALSCWARZ 4A, SPEZIALSCHWARZ 250 and PRINTEX U (all from Degussa Co.).

As alternative to carbon black the following non-exclusive examples of colorants are particularly usable in the present invention: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (C.I. 73915), Hostaperm Red Violet ER (C.I. 46500), Permanent Carmine FBB (C.I. 12485) and Hostaperm Blue B2G (74160) (almost all available from Hoechst AG).

The colorants can be used separately or they can be blended for a desired colour. For instance, a mixture of three pigments giving black can be used as an alternative to carbon black.

When the photosensitive element of the present invention is used as image setting film, in other words when the finished image must serve as master for the exposure of a printing plate, the image forming substance has to be absorptive in the UV spectral region. In this case UV absorbing compounds such as Bonasorb UA-3701 and Bonasorb UA-3901 (both available from Orient Chemical Industries, Ltd., Japan), or Blankophor (Bayer AG) can be used instead of dyes or pigments, or in addition to dyes or pigments when the possibility of a visual inspection of the image is also desired.

As binder for the image forming layer an aqueous polymer latex or mixture of latices is preferably used. Examples of suitable polymer latices include co(ethylacetate-methacrylic acid) (86/24), co(vinylacetate-ethylene), polyurethane (e.g. BAYDERM FINISH 80UD—Bayer AG), co(styrene-butadiene) (e.g. 45/55), co(butadiene-acrylonitrile), co(butadiene-methylmethacrylate-itaconic acid), and co(styrene-acrylonitrile). Most preferably, polyethylene latices or polyethylenearyl latices are used.

The essential ingredients of the photosensitive layer are a binder, a monomer, a photoinitiator and optionally a toning agent.

Examples of useful binders include organic solvent-soluble polymers, e.g. polymers derived from α,β-ethylenically unsaturated compounds such as e.g. polyvinyl acetate, a vinyl acetate-vinyl chloride copolymer, a styrene-butadiene copolymer, polyethylene, and polypropylene. Other suitable binders for the photosensitive layer are styrene/maleic anhydride copolymers and their half esters, acrylic polymers and copolymers, polyamides, polyvinyl pyrrolidones, cellulose and its derivatives and phenolic resins. Especially preferred binders are polyvinyl acetals, such as polyvinyl butyral and polyvinyl propional. Still other preferred binders are polyvinyl formals which are commercially available from Monsanto as FORMVAR. The formal content of the polyvinyl formals is approximately 65% to 86% expressed as percent polyvinyl formal. The acetate content is approximately 9% to 30% expressed as percent polyvinyl acetate. The hydroxyl content is approximately 5% to 7% as expressed as percent polyvinyl alcohol. The average molecular weight is between 10,000 and 40,000. Most preferred binders are (co)polyesters and co(vinylidenechloride-vinylacetate-methacrylic acid).

A wide variety of photopolymerisable and photo-crosslinkable compounds can be used in the present invention. Suitable monomers include e.g. the monomers disclosed in DE-OS Nos. 4005231, 3516256, 3516257, 3632657 and U.S. Pat. No. 4,629,676, unsaturated esters of polyols, particularly such esters of the alpha-methylene carboxylic acids, e.g. ethylene diacrylate, glycerol tri(meth) acrylate, diethyleneglycol dimethacrylate, 1,3-propanediol di(meth)acrylate 1,2,4-butanetriol tri(meth)acrylate, 1,4-cyclohexanediol di(meth)acrylate, 1,4-benzenediol di(meth) acrylate, pentaerythritol tetra(meth)acrylate, pentaerythritol triacrylate, dipentaerythritol pentacrylate, trimethylolpropane triacrylate, 1,5-pentanediol di(meth)acrylate, the bis acrylates and methacrylates of polyethylene glycols of molecular weight 200–500, and the like: unsaturated amides, particularly those of the alphamethylene carboxylic acids, and especially those of Alpha-Omega-diamines and oxygen-interrupted omega-diamines, such as methylene bis-acrylamide, methylene bis-methacrylamide, 1,6-hexamethylene bis-acrylamide, diethylene triamine tris-methacrylamide, bis(gamma-methacrylamidopropoxy) ethane, beta-methacrylamidoethyl methacrylate, N-(beta-hydroxyethyl)-beta-(methacrylamido)ethyl acrylate and N,N-bis(beta-methacrylolyoxyethyl)acrylamide, vinyl esters e.g. divinyl succinate, divinyl adipate, divinyl phthalate, divinyl butane-1,4-disulphonate; and unsaturated aldehydes, e.g. sorbaldehyde (hexadienal). The photopolymerizable composition may also comprise polymers and/or oligomers comprising 2 or more polymerizable functions e.g. acrylated epoxies, polyester acrylates, urethane acrylates etc.. It will be clear that these monomers and/or polymers and/or oligomers can be used in admixture.

It is also possible to use monofunctional (meth)acrylic acid esters as monomer provided they are not to volatile and do not spread an unwanted odour. Suitable compounds include n-octylacrylate, n-octylmethacrylate, decylacrylate, decylmethacrylate, stearylacrylate, stearylmethacrylate, cyclohexylacrylate, cyclohexylmethacrylate, phenylethylacrylate, phenylethylmethacrylate.

The most preferred polymerizable compounds comprise one or more (meth)acrylate functional groups.

Other classes of photopolymerizable compounds containing (a) (meth)acrylate group(s) are reactive multifunctional monomers disclosed in EP 0 502 562 and represented by general formula (I) or (II):

$$A[-NHCO-X-L^1(-(L^2)_u-OCO-CR^1=CH_2)_n]_m \quad (I)$$

wherein n represents an integer from 1 to 3, m equals an integer of 3 to 6 when n equals 1, and 2 to 6 when n equals 2 or 3, and u equals 0 or 1;
A represents an organic group of the following nature being 3 to 6 valent when n equals 1 and being 2 to 6 valent when n equals 2 or 3:

a) a hydrocarbon residue containing 5 to 25 carbon atoms which may be interrupted by one or more ether, ester or amide functions;

b)

with $A^1$ representing a linear or branched aliphatic residue that may contain 0 to 3 O-atoms and 2 to 20 C-atoms, an aromatic residue containing 6 to 24 carbon atoms, an aromatic aliphatic residue containing 7 to 28 C-atoms or an cycloaliphatic residue containing 6 to 26 C-atoms, $R^3$ and $R^4$ each independently representing a hydrogen or a methyl group, $A^2$ representing a hydrocarbon residue containing 5 to 25 carbon atoms, o represents an integer of 0 to 5 and p represents an integer of 2 to 6 when n equals 2 or 3 and represents an integer of 3 to 6 when n equals 1;

c)

wherein $A^1, A^2, R^3, R^4$, o and p have the same meaning as defined above d)

wherein $A^1, A^2, R^3, R^4$, o and p have the same meaning as defined above;
G represents $-O-CO-NH-Y(-COO-)_q-$;
 wherein Y represents a divalent (cyclo)aliphatic residue containing 2 to 15 C-atoms and that may contain an ester, ether or urethane function, and q represents 0 or 1
Q represents a linear or branched aliphatic hydrocarbon residue containing 3 to 15 carbon atoms and which may comprise 1 to 3 oxygen bridges and r equals 0 or 1,
X represents O or $NR^2$,
$L^1$ represents an aliphatic hydrocarbon residue that is at least divalent and that may comprise 1 to 3 O-atoms,
$L^2$ represents a lower alkylene of 1 to 6 C-atoms which may be branched or linear,
$R^1$ represents hydrogen or a methyl group,
$R^2$ represents hydrogen or a lower alkyl group of 1 to 6 C-atoms;

wherein
Ur represents a divalent or trivalent condensed urea residue;
Z represents O or $NR^{10}$ with $R^{10}$ representing alkyl containing 1 to 12 C-atoms;
$R^7$ represents a divalent hydrocarbon residue containing 2 to 25 C-atoms;
$R^8$ represents a hydrocarbon residue with a valence between 2 and 6, and containing 2 to 18 C-atoms, which can be linear or branched and which can be interrupted by upto 3 O atoms;
$R^9$ represents hydrogen or methyl;
α represents an integer from 1 to 5, and

β equals 2 or 3.

Preferably used monomers comprise one of the following residues as hydrocarbon residue A and/or $A^2$ of general formula (I):

Ia $-(CH_2)_s-CH-(CH_2)_t-$  Ib

Ic

Id wherein $R^5$ and $R^6$ each independently represent hydrogen or a lower alkyl of 1 to 6 C-atoms, s and t independently represent an integer from 1 to 6 and wherein the aliphatic hydrocarbon residues Ia, Ic and Id comprise 2 to 6 free valences.

Examples of monomers according to formula (I) suitable for use in accordance with the present invention are shown in table A.

$[(CH_2=\underset{CH_3}{\underset{|}{C}}-COO-CH_2)_2-CH-OOCNH-(CH_2)_5-COO-CH_2]_i$
$[CH_2=\underset{CH_3}{\underset{|}{C}}-COO-CH_2-CH_2-OOCNH-(CH_2)_5-COO-CH_2]_j$ 〉C  7 i and j are respectively 2.5 and 1.5 indicating that compound 7 is a mixture of compounds obtained by reacting i equivalents of glycerine-dimethacrylate and j equivalents of hydroxyethyl methacrylate as disclosed in DE 3,703,130.

TABLE A

| | |
|---|---|
| $CH_3-CH_2-C[CH_2O-(CH_2CH-O)_{\overline{2,4}}-CO-(CH_2)_5-NHCOO-CH_2-CH_2-O-CO-C=CH_2]_3$<br>　　　　　　　　　　　　$|$　　　　　　　　　　　　　　　　　　　　　　　　　$|$<br>　　　　　　　　　　　　$CH_3$　　　　　　　　　　　　　　　　　　　　　　　　　$CH_3$ | 1 |
| $CH_3-CH_2-C[CH_2O-(CH_2CH-O)_{\overline{2,4}}-CO-(CH_2)_5-NHCOO-CH-(CH_2-O-CO-C=CH_2)_2]_3$<br>　　　　　　　　　　　　$|$　　　　　　　　　　　　　　　　　　　　　　　　　　　　　　　　$|$<br>　　　　　　　　　　　　$CH_3$　　　　　　　　　　　　　　　　　　　　　　　　　　　　　　　　$CH_3$ | 2 |
| $C[CH_2O-CO-(CH_2)_5-NH-COO-CH_2-CH_2-OCO-CH=CH_2]_4$ | 3 |
| $C[CH_2O-CO-(CH_2)_5-NH-COO-CH_2-CH_2-OCO-C=CH_2]_4$<br>　　　　　　　　　　　　　　　　　　　　　　　　　　　　　　　　$|$<br>　　　　　　　　　　　　　　　　　　　　　　　　　　　　　　　　$CH_3$ | 4 |
| $[(CH_2=\underset{CH_3}{\underset{|}{C}}-COO-CH_2)_2-CH-OOCNH-(CH_2)_5-COO-CH_2]_2$<br>$[CH_2=\underset{CH_3}{\underset{|}{C}}-COO-CH_2-CH_2-OOCNH-(CH_2)_5-COO-CH_2]_2$ 〉C | 5 |
| $[(CH_2=\underset{CH_3}{\underset{|}{C}}-COO-CH_2)_2-CH-OOCNH-(CH_2)_5-COO-CH_2]_i$<br>$[CH_2=\underset{CH_3}{\underset{|}{C}}-COO-CH_2-CH_2-OOCNH-(CH_2)_5-COO-CH_2]_j$ 〉C | 6 | i and j are respectively 3.5 and 0.5 indicating that compound 6 is a mixture of compounds obtained by reacting i equivalents of glycerine-dimethacrylate and j equivalents of hydroxyethyl methacrylate as disclosed in DE 3,703,130.

$$\text{C[CH}_2\text{O}-\text{CO(CH}_2)_5-\text{NH}-\text{COO}-\text{CH}-(\text{CH}_2-\text{O}-\text{CO}-\underset{\overset{|}{\text{CH}_3}}{\text{C}}=\text{CH}_2)_2]_4 \qquad 8$$

$$[\text{CH}_2=\underset{\overset{|}{\text{CH}_3}}{\text{C}}-\text{COO}-\text{CH}_2-\text{CH}_2-\text{OOCNH}-(\text{CH}_2)_5-\text{CO}-(\text{O}-\underset{\overset{|}{\text{CH}_3}}{\text{CHCH}_2})_{2.4}-\text{O}-\text{CH}_2\underset{}{}\overset{\text{C}_2\text{H}_4}{}\qquad 9$$
$$[\text{CH}_2=\underset{\overset{|}{\text{CH}_3}}{\text{C}}-\text{COO}-\text{CH}_2-\text{CH}_2-\text{OOCNH}-(\text{CH}_2)_5-\text{CO}-(\text{O}-\underset{\overset{|}{\text{CH}_3}}{\text{CHCH}_2})_{2.4}-\text{O}-\text{CH}_2]_2\overset{}{\text{C}}$$

$$\text{CH}_3-\text{CH}_2-\text{C[CH}_2\text{O}-(\underset{\overset{|}{\text{CH}_3}}{\text{CH}_2\text{CH}}-\text{O})_{2.4}-\text{CO}-(\text{CH}_2)_5-\text{NHCOO}-\text{CH}_2-\text{CH}_2-\text{O}-\text{CO}-\text{CH}=\text{CH}_2]_3 \qquad 10$$

$$\text{C[CH}_2\text{O}-\text{CO}-\text{NH}-\text{CH}_2-\underset{\overset{|}{\text{CH}_3}}{\overset{\overset{\text{CH}_3}{|}}{\text{C}}}-\text{CH}_2-\text{CH}-\text{CH}_2-\text{CH}_2-\text{NH}-\text{COO}-\text{CH}-(\text{CH}_2-\text{O}-\text{CO}-\underset{\overset{|}{\text{CH}_3}}{\text{C}}=\text{CH}_2)_2]_4 \qquad 11$$

$$\text{C[CH}_2\text{O}-\text{CO}-\text{NH}-(\text{CH}_2)_6-\text{NH}-\text{COO}-\text{CH}-(\text{CH}_2-\text{O}-\text{CO}-\underset{\overset{|}{\text{CH}_3}}{\text{C}}=\text{CH}_2)_2]_4 \qquad 12$$

$$\text{C}_2\text{H}_5-\text{C[CH}_2\text{O}-\text{CO}-\text{NH}-(\text{CH}_2)_6-\text{NH}-\text{COO}-\text{CH}-(\text{CH}_2-\text{O}-\text{CO}-\underset{\overset{|}{\text{CH}_3}}{\text{C}}=\text{CH}_2)_2]_3 \qquad 13$$

14. $(CH_2=\underset{CH_3}{\overset{|}{C}}-COO-CH_2)_2-CH-OOCNH-\text{[cyclohexyl]}-CH_2-\text{[cyclohexyl with CH}_3\text{]}$ with substituents $NHCOO-CH-(CH_2-O-CO-\underset{CH_3}{\overset{|}{C}}=CH_2)_2$ and $NHCOO-CH_2-CH_2-OCO-\underset{CH_2}{\overset{CH_3}{\overset{|}{C}=}}$ 15. $(CH_2=\underset{CH_3}{\overset{|}{C}}-COO-CH_2)_2-CH-OOCNH-\text{[cyclohexyl]}-CH_2-\text{[cyclohexyl with CH}_3\text{]}$ with substituents $NHCOO-CH-(CH_2-O-CO-\underset{CH_3}{\overset{|}{C}}=CH_2)_2$ and $NHCOO-(CH_2)_4-OCO-CH=CH_2$

16. $(CH_2=\underset{CH_3}{\overset{|}{C}}-COO-CH_2)_2-CH-OOCNH-\text{[cyclohexyl]}-CH_2-\text{[cyclohexyl]}$ with substituents $NHCOO-CH-(CH_2-O-CO-\underset{CH_3}{\overset{|}{C}}=CH_2)_2$ and $NHCOO-CH-(CH_2-O-CO-\underset{CH_3}{\overset{|}{C}}=CH_2)_2$ 17. $CH_2=CH-COO-(CH_2)_3-OOCNH-\text{[cyclohexyl]}-CH_2-\text{[cyclohexyl]}$ with substituents $NHCOO-(CH_2)_3-OCO-CH=CH_2$ and $NHCOO-(CH_2)_3-OCO-CH=CH_2$ 18. $(CH_2=\underset{CH_3}{\overset{|}{C}}-COO-CH_2)_2-CH-OOCNH-\text{[cyclohexyl]}-CH_2-\text{[cyclohexyl]}$ with substituents $NHCOO-CH-(CH_2-O-CO-\underset{CH_3}{\overset{|}{C}}=CH_2)_2$ and $NHCOO-CH_2-CH_2-OCO-\underset{CH_2}{\overset{CH_3}{\overset{|}{C}=}}$ 19. $C_2H_5-C\left[CH_2O-CO-NH-CH_2-\text{[norbornane/dicyclopentane]}-CH_2-NH-COO-CH-(CH_2-O-CO-\underset{CH_3}{\overset{|}{C}}=CH_2)_2\right]_3$

-continued

The fractal indexes in the formulas 1, 2 and 10 indicate that these formulas represent a mixture of compounds having a different length of the ethylene-oxide piece in said formulas the indexes thus representing an avarage of said ethylene-oxide piece. The formulas 14 to 23 represent a mixture of structural isomers and can be used in accordance with the present invention without separation of the isomers.

The monomers corresponding to general formula (I) are known and can be prepared according to the German patent application numbers 3,522,005, 3,703,080, 3,643,216, 3,703,130, 3,917,320 and 3,743,728.

In general monomer formula (II) preferred condensed urea residues represented by Ur are following structural units:

Examples of useful monomers according to general formula (II) are listed below in table B:

TABLE B

TABLE B-continued

TABLE B-continued

The most preferred monomers for use in the present invention are trimethylolpropane trimethacrylate, (highly) ethoxylated trimethylolpropane triacrylate and ethyleneglycol diacrylate.

The photoinitiator system, present in the photosensitive layer, comprises one or more compounds which directly furnish free-radicals when activated by actinic radiation. It can also comprise a plurality of other compounds, e.g. spectral sensitizers, hydrogen donors.

Numerous conventional photoinitiators systems may be used provided they are compatible with the other ingredients of the element. Useful photoinitiators are ketoxime-esters. Preferred photoinitiator systems are 2,4,5-triphenylimidazolyl dimers in combination with chain transfer agents, or hydrogen donors, such as are disclosed in U.S. Pat. No. 3,479,185, U.S. Pat. No. 3,784,557, U.S. Pat. No. 4,311,783 and U.S. Pat. No. 4,622,286. Preferred hexaarylbisimidazoles (HABI) are 2-o-chloro-substituted hexaphenylbisimidazoles in which the other positions on the phenyl radicals are unsubstituted or substituted with chloro, methyl or methoxy. The most preferred initiator is o.-Cl-HABI, i.e., 2,2'-bis-(o-chloro-phenyl)-4,4,5,5',tetraphenyl-1,1'-bisimidazole (or simply "bisimidazole") corresponding to following chemical formula Hydrogen donor compounds useful as chain tranfer agents in the photopolymer layer include: 2-mercaptobenzoxazole, 2-mercaptobenzothiazole, 4-methyl-4H-1,2,4,-triazole-3-thiol, and the like. A preferred hydrogen donor is 2-mercaptobenzoxazole with following formula:

Although the HABI initiating systems described above are preferred, other initiating systems may be used in practicing this invention. Useful photoinitiators described in U.S. Pat. No. 2,760,863 include vicinal ketaldonyl alcohols, such as benzoin, pivaloin, acyloin ethers, e.g. benzoin methyl and ethyl ethers, and α-hydrocarbon-substituted aromatic acyloins, such as α-methylbenzoin. Further useful photoinitiators include quinoxaline compounds as described in U.S. Pat. No. 3,765,898, the vicinal polyketaldonyl compounds in U.S. Pat. No. 2,367,660, the α-carbonyls in U.S. Pat. Nos. 2,367,661 and 2,367,670, the acyloin ethers in U.S. Pat. No. 2,448,828, the triarylimidazolyl dimers in U.S. Pat. No. 3,479,185, the α-hydrocarbon substituted aromatic acyloins in U.S. Pat. No. 2,722,512, polynuclear quinones in U.S. Pat. Nos. 2,951,758 and 3,046,127, and s-triazines in U.S. Pat. No. 4,656,272.

The photoinitiator is preferably present in the photosensitive layer in an amount ranging from 2 to 30% by weight.

Many of the well known photoinitiator systems have limited applicability because they are activated only by UV radiation. For exposure in the visible region, e.g. by lasers, the use of so-called sensitizers is indispensable. A large number of free-radical generating systems have been used as sensitizers for the visible region for photopolymerizable compositions. U.S. Pat. No. 3,652,275 discloses selected bis(p-dialkylaminobenzylidene)ketones as sensitizers for HABI initiator systems. U.S. Pat. No. 4,162,162 discloses selected sensitizers derived from aryl ketones and p-dialkylaminoaldehydes. U.S. Pat. No. 4,987,230 and U.S. Pat. No. 4,987,230 also disclose sensitizers for HABI systems.

A preferred sensitizer is 7-diethylamino-4-methylcoumarin.

The photopolymerisable layer can be applied on top of the image forming layer in the following way. The photosensitive composition is coated on a support serving furtheron as transparent cover sheet. Then both prepared packs (support+image forming layer on the one hand, and photosensitive layer+cover sheet on the other hand) are laminated together. Lamination may be conducted by putting the two elements in contact and then introducing the materials into the nip of a pair of heated laminating rollers under suitable pressure. Suitable laminating temperatures usually range from approximately 60° C. to 120° C., preferably from 70° C. to 100° C.

Like the support the cover sheet is preferably composed of polyethylene terephthalate. When the photosensitive element is designed for contactexposure by a UV source the thickness of the PET is comprised preferably between 12 and 100 μm, most preferably between 12 and 50 μm. When the photosensitive element is meant for laser exposure the thickness preferably ranges between 50 and 200 μm, most preferably around 100 μm.

When the photosensitive layer is not sensitized to a visual part of the spectrum the image-wise exposure is performed in a conventional contact apparatus equipped with a UV light source. However, when the photosensitive layer is sensitized to a visual part of the spectrum an information-wise exposure by means of a laser can be performed, e.g. a Ar ion laser or a He—Ne laser.

Finally the photo mode image is dry developed by delamination. This can be performed manually or in a delamination apparatus. In a preferred way of doing the stripping layer is held planar and the medium is peeled off at an angle of about 180° at a speed of about 10 m/min. As a result, in the unexposed areas, the image forming layer and part of the cohesively broken photosensitive layer adhere to said support or its subbing layer when present thus forming a positive image, whereas in the exposed areas the photopolymerised photosensitive layer and the image forming layer adhere to the cover sheet thus forming a negative image.

Figure 1:
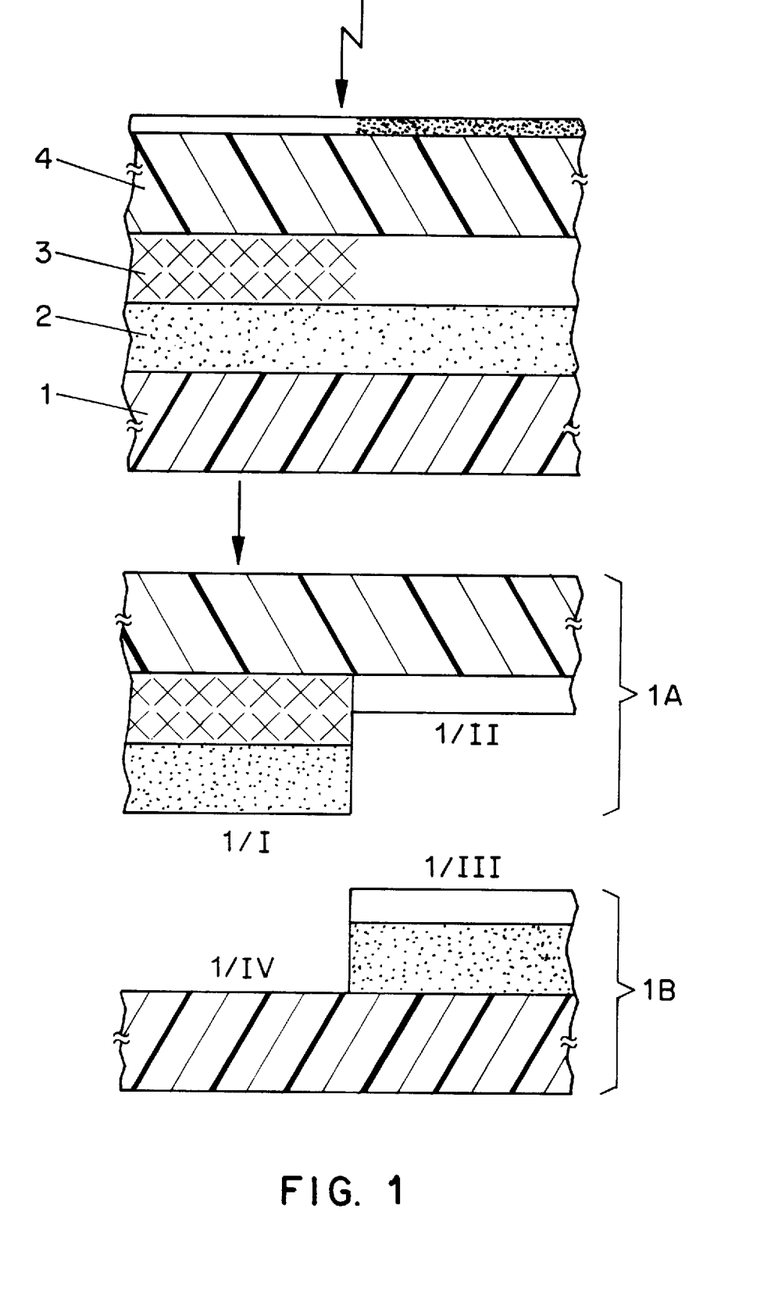

The original layer arrangement and the status after the peel apart step in the exposed and non-exposed areas are illustrated in FIG. 1, wherein:

(1): support (2): image forming layer;

(3): photosensitive layer (XXXX: polymerised parts);

(4): cover sheet;

1A: negative image after peel apart step, wherein 1/I represents the image parts and 1/II represents the non-image parts;

1B: positive image after peel apart step, wherein 1/III represents the image parts and 1/IV repesents the non-image parts.

It is essential for the successful practice of the present invention that the photosensitive layer breaks cohesively in the unexposed areas during the delamination step. Therefore the cohesive strenght/adhesive strenght relationships as described in the summary must be obeyed. These relationships are established by carefully optimizing following parameters, which have a complex relationship with each other: the glass transition temperature ($T_g$) of the binder, the ratio monomer to binder, and the melt viscosity of the monomer. Thanks to the cohesive rupture of the photosensitive layer in the unexposed areas the positive image shows reduced spacer properties when further exposed as intermediate, compared to the embodiments of U.S. Pat. No. 4,288,525. Moreover, in the exposed areas the image forming layer is completely present in the separated negative image, so that the positive image shows a usable low minimum density.

In a most preferred embodiment an overall curing step is performed by means of UV or visible light on the parts of the cohesively broken photosensitive layer present on top of the positive image. In this way the positive image is protected from physical damage.

In an alternative process of the present invention an additional release layer is present between the image forming layer and the photosensitive layer. In this case, after exposure and delamination, the photosensitive layer is not cohesively broken in the unexposed areas but adheres entirely to the cover sheet, while the release layer and the image forming layer adhere to the support or its subbing layer. This positive image is protected against abrasion and scratches by means of the release layer so that no post-curing steo is required. In the exposed areas the image forming layer+the release layer+the photosensitive layer adhere to the cover sheet thus forming a negative image.

A typical release layer contains a binder and one or more of the typical ingredients for release layers known in the art such as waxes, polyethylene, silicones, fluorinated polymers such as Teflon, silica particles (e.g. SEAHOSTAR KE types, Nippon Shokukai Co), colloidal silica, polymeric beads (e.g. polystyrene, polymethylmethacrylate), hollow polymeric core/sheat beads (e.g. ROPAQUE particles, Rohm and Haas Co), beads of siliconised pigments like siliconised silica (e.g. TOSPEARL types, Toshiba Silicones Co), and matting agents. The release layer can further contain thermoadhesive polymers. In a preferred embodiment the release layer contains a mixture of HORDAMER PEO2 (a 38% polyethylene dispersion in water—Hoechst AG), HOSTFLON TF 5032 (a 62% Teflon dispersion in water—Hoechst AG), and the thermoadhesive polymer BAYSTAL P2000 (a 50% dispersion of co(butadiene-styrene-acrylic acid-acrylamide) —Bayer AG). The preferred coverage of the release layer ranges between 0.1 and 3 $g/m^2$.

Figure 2:
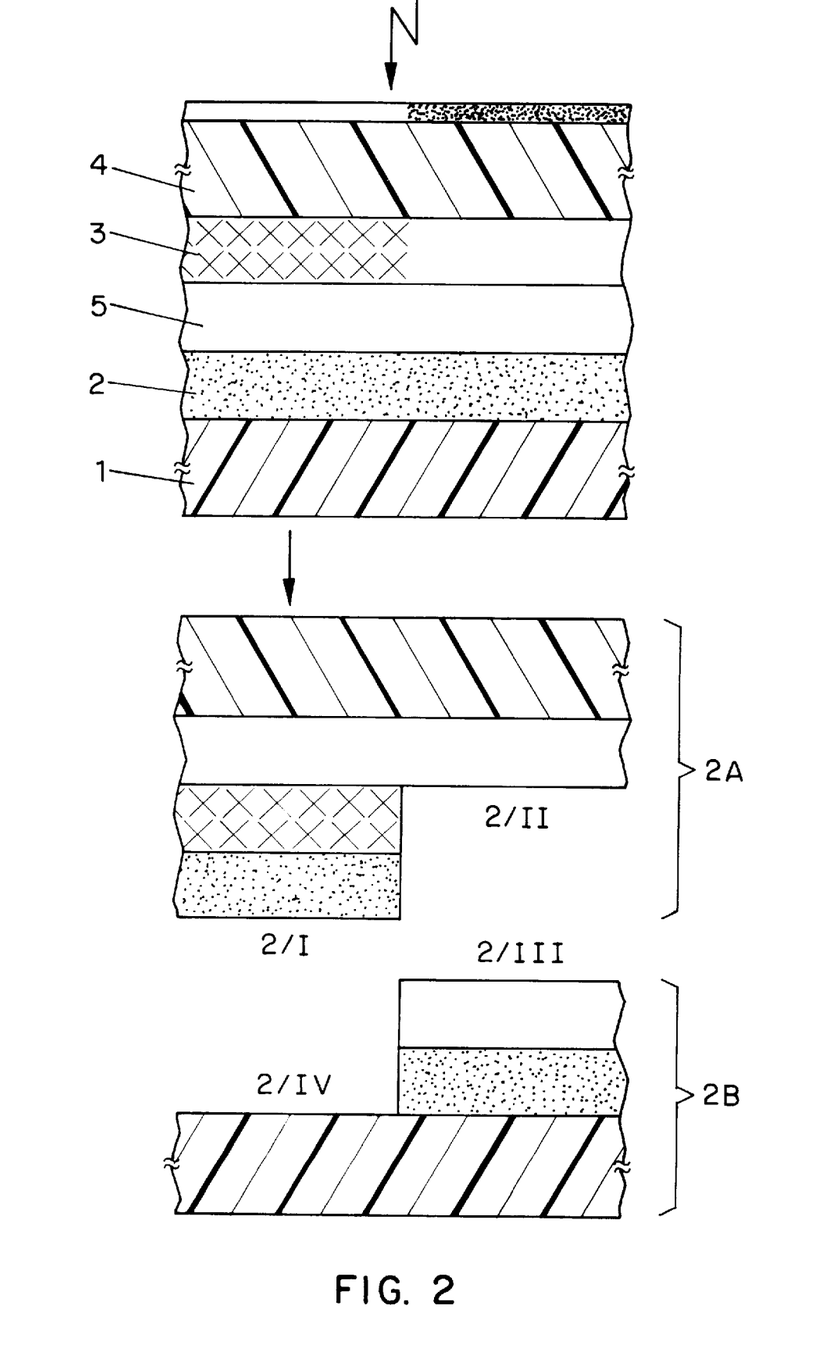

The original layer arrangement and the status after the peel apart step in this alternative embodiment are illlustrated by FIG. 2, wherein:

(1) to (4): layers identical to FIG. 1;
(5): release layer;
2A: negative image after peel apart step, wherein 2/I represents the image parts and 2/II represents the non-image parts;
2B: positive image after peel apart step, wherein 2/III represents the image parts and 2/IV repesents the non-image parts.

When the recorded information is provided by a phototype- or image-setter the obtained photo mode image can be used as master for the exposure of a printing plate or a graphic arts contact material.

The finished image can also be used for direct visual inspection, e.g. when the recorded information serves as a hard copy of medical radiographic information.

The present invention will be illustrated by the following examples without however being limited thereto.

EXAMPLES
Preparation of Photosensitive Elements

Three different photosensitive coating compositions were prepared containing various amount of the following compounds:

compound 1 (CP 1): VITEL PE200=copoly(isophthalate-terephtalate), (10% solution in toluene/ethylacetate; 80/20)=binder;

compound 2 (CP 2): DYNAPOL 1420 copolyester (binder);

compound 3 (CP 3) a photopolymerisable monomer (PETRA) with following formula:

compound 4 (CP 4): a spectral sensitizer with formula:

compound 5 (CP 5): photopolymerisable monomer (PETRI) with formula:

compound 6 (CP 6): variant of Michler's ketone with following formula:

compound 7 (CP 7): photoinitiator benzophenone with formula:

compound 8 (CP 8): photoinitiator o.-Cl-HABI with formula:

compound 9 (CP 9): inhibitor IONOL having following formula:

compound 10 (CP 10): toning agent benzoxazine, formula:

solvent mixture toluene/ethylacetate (To/EtAc) 80%/20%;

solvent methylethylketone (MEK);

The composition (all expressed in gram) of the three photosensitive coating solutions (PCS) is represented in table 1.

TABLE 1

|  | PCS 1 | PCS 2 | PCS 3 |
|---|---|---|---|
| CP 1 | 9.6 | 9.6 | — |
| CP 2 | — | — | 12.5 |
| CP 3 | 2.8 | — | 2.5 |
| CP 4 | 0.039 | — | — |
| CP 5 | — | 2.8 | — |
| CP 6 | — | 0.025 | 0.03 |
| CP 7 | — | 0.25 | — |
| CP 8 | 0.3 | — | 0.3 |
| CP 9 | 0.01 | 0.02 | 0.0035 |
| CP 10 | 0.017 | — | 0.017 |
| To/EtAC | 12.3 | 12.3 | — |
| MEK | — | — | 9.6 |

These photopolymerisable compositions were applied to a unsubbed polyethylene terephthalate support (1) having a thickness of 63 μm by means of 50 μm BRAIVE coating knive. The coated photosensitive layers (2) were dried in an oven for F3 min at 65° C.

Preparation of Carbon Black Containing Layers

Following carbon black containing compositions (C1 to C4) (all ingredients expressed in gram) were prepared (table 2):

TABLE 2

| ingredients* | C1 | C2 | C3 | C4 |
|---|---|---|---|---|
| DIS 1 | — | 13.8 | — | 13.8 |
| DIS 2 | — | — | 10 | — |
| DIS 3 | 13.8 | — | — | — |
| copoly** | 2.7 | — | 2 | 2.7 |
| water | 13.5 | 16.2 | 18 | 13.5 |

*:
DIS 1 = 6% carbon black dispersion in a 4.8% poly(ethylacrylate) latex;
DIS 2 = 6% carbon black dispersion in a 4.8% poly(ethylene) latex;
DIS 3 = 6% carbon black dispersion in a 4.8% copoly(ethylacrylate-methacrylic acid-methylmethacrylate; 37.5%/16.5%/46%) latex.
**co(styrene-butadiene-acrylic acid-acrylamide; 62/32/2/4%)

These carbon black containing coating compositions were applied to a 100 μm thick polyethylene terephthalate support (4). The obtained carbon containing layers (3) were dried for 5 min on the hot coating plate and further dried for 2 min in an oven at 50° C.

Further a variant of C4 was prepared. A release layer (RL) was coated on top of the carbon containing layer of C4 (C4+RL). The coating composition corresponding to this release layer contained:

2.6 g of a 38% polyethylene dispersion in water;

0.8 g of a 62% Teflon dispersion in water;

3 g of 50% dispersion of co(styrene-butadiene-acrylic acid-acrylamide; 62/32/2/4%) in water.

The release layer was coated at a wet thickness of 20 μm. Immediately after coating it was dried in a hot air stream of about 50° C.

Preparation of Complete Photosensitive Elements

Several combinations of the photosensitive layer pack (1)+(2) and the carbon black layer pack (3)+(4) or (5)+(3)+(4) were laminated to each other in a CODOR LPP650 (Dorned BV—The Netherlands) at 45° C. and a conveying speed of 50 cm/min. In this way finished photosensitive elements 1 to 7 were obtained. The different combinations are represented in table 3.

TABLE 3

| sample | photosensitive layer pack | carbon layer pack |
|---|---|---|
| 1 | PSC 2 | C1 |
| 2 | PSC 2 | C4 |
| 3 | PSC 2 | C4 + RL |
| 4 | PSC 1 | C4 |
| 5 | PSC 3 | C4 |
| 6 | PSC 2 | C2 |
| 7 | PSC 2 | C3 |

Exposure and Processing

All samples except sample 4 were exposed by UV radiation in a CDL 1501 UV-contactexposure apparatus (F1500 μW/cm$^2$), marketed by Agfa-Gevaert N.V., through a photograpic mask in contact with support (1).

Sample 4 which was spectrally sensitized was exposed in scanner equiped with an Ar ion laser emitting at 488 nm. The spot diameter was 30 μm (1/e$^2$). The drum speed was 8.8 m/s and the energy on film was $3.10^3$ J/m$^2$.

While support (4) was kept flat support (1) was peeled off at an angle of 180° (so-called peel back method). The separation pattern was like represented in FIG. 2 for sample 3, having a release layer, and like FIG. 1 for all the other samples.

Results

Table 4 represent the results concerning obtained image quality and physical properties.

TABLE 4a

| sample | exposure | image part | Dmax | Dmin | line width rendering |
|---|---|---|---|---|---|
| 1 | UV | 1A | 2.5–2.9 | 0.24 | —* |
| 2 | UV | 1A | 3.9–4.1 | 0.16 | 15 μm |
| 3 | UV | 2B | 3.75 | 0.08 | 30 μm |
| 4 | L | 1A | 3.8–4.2 | 0.16 | 25 μm |
| 5 | UV | 1A | 3.5–4.4 | 0.17 | 20 μm |
| 6 | UC | 1A | 3.5–4.0 | 0.16 | 20 μm |
| 7 | UV | 1A | 3.2–4.0 | 0.18 | 10 μm |

*sample 1 showed practically no image-wise differentiation.

TABLE 4b

| sample | scratch sensitivity* (image parts) | tackiness* (non-image parts) |
|---|---|---|
| 1 | — | — |
| 2 | 2 | 2 |
| 3 | 4 | 5 |
| 4 | 2 | 2 |
| 5 | 2 | 2 |
| 6 | 1 | 2 |
| 7 | 3 | 2 |

*determined before any post-treatment); expressed by a relative arbitrary quality scale, ranging from 1 (very scratch sensitive or very tacky) to 5 (non-scratch sensitive or non tacky at all).

We claim:

1. A photosensitive element comprising, in order:
   (A) a support;
   (B) an image forming layer comprising a pigment;
   (C) a photosensitive layer comprising a free radical polymerisable monomer having at least two ethylenically unsaturated groups, a binder, and a photoinitiator, wherein the ratio of the amount by weight of the monomer to the amount by weight of the binder is from about 0.5 to about 4.0; and
   (D) a transparent cover sheet;
wherein when said element has not yet been exposed to actinic radiation, the cohesive strength of said photosensitive layer is lower than both the adhesive strength between said image forming layer and said support and the adhesive strength between said photosensitive layer and said cover sheet, whereas, upon exposure to actinic radiation through said cover sheet, the cohesive strength of said photopolymerised photosensitive layer and the adhesive strength of said photopolymerised photosensitive layer to said image forming layer both become higher than the adhesive strength between said image forming layer and said support thereby creating a cohesive rupture of the unexposed portions of said photosensitive layer when said support and said cover sheet are peeled apart.

2. A photosensitive element according to claim 1 wherein said pigment is carbon black.

3. A photosensitive element according to claim 1 wherein said image forming layer has a density (UV) of at least 3.0.

4. A photosensitive element according to claim 1 wherein said free radical polymerisable monomer is chosen from the group consisting of trimethylolpropane trimethacrylate, ethoxylated trimethylolpropane triacrylate and ethyleneglycol diacrylate.

5. A process for the formation of a photo mode image comprising the following steps:
   (A) exposing information-wise to actinic radiation a photosensitive element comprising, in order:
       (i) a support;
       (ii) an image forming layer comprising a pigment;
       (iii) a photosensitive layer comprising a free radical polymerisable monomer having at least two ethylenically unsaturated groups, a binder, and a photoinitiator, wherein the ratio of the amount by weight of the monomer to the amount by weight of the binder is from about 0.5 to about 4.0; and
       (iv) a transparent cover sheet;
   wherein when said element has not yet been exposed to actinic radiation, the cohesive strength of said photosensitive layer is lower than both the adhesive strength between said image forming layer and said support and the adhesive strength between said photosensitive layer and said cover sheet, whereas, upon exposure to actinic radiation through said cover sheet, the cohesive strength of said photopolymerised photosensitive layer and the adhesive strength of said photopolymerised photosensitive layer to said image forming layer both become higher than the adhesive strength between said image forming layer and said support; and
   (B) peeling apart said support and said cover sheet whereby, in the unexposed areas, said image forming layer and part of the cohesively broken photosensitive layer adhere to said support thus forming a positive image, whereas in the exposed areas the photopolymerised photosensitive layer and the image forming layer adhere to said cover sheet thus forming a negative image.

6. A process according to claim 5 further comprising the following step (C); curing by means of UV or visible light the parts of the cohesively broken photosensitive layer present on top of said positive image.

7. A process according to claim 5 wherein said pigment is carbon black.

8. A process according to claim 5 wherein said image forming layer has a density (UV) of at least 3.0.

9. A process according to claim 5 wherein said free radical polymerisable monomer is chosen from the group consisting of trimethylolpropane trimethacrylate, ethoxylated trimethylolpropane triacrylate and ethyleneglycol diacrylate.

10. A photosensitive element comprising, in order:
    (A) a support;
    (B) an image forming layer comprising an image forming substance;
    (C) a release layer;
    (D) a photosensitive layer comprising a free radical polymerisable monomer having at least two ethylenically unsaturated groups, a binder, and a photoinitiator, wherein the ratio of the amount by weight of the monomer to the amount by weight of the binder is from about 0.5 to about 4.0,; and
    (E) a transparent cover sheet.

11. A photosensitive element according to claim 10 wherein said image forming substance is a pigment.

12. A photosensitive element according to claim 11 wherein said pigment is carbon black.

13. A photosensitive element according to claim 10 wherein said image forming layer has a density (UV) of at least 3.0.

14. A photosensitive element according to claim 10 wherein said free radical polymerisable monomer is chosen from the group consisting of trimethylolpropane trimethacrylate, ethoxylated trimethylolpropane triacrylate and ethyleneglycol diacrylate.

15. A photosensitive element according to claim 10 wherein said release layer contains a mixture of polyethylene wax and poly(tetrafluoroethylene).

16. A process for the formation of a photo mode image comprising the following steps:
    (A) exposing information-wise to actinic radiation a photosensitive element comprising, in order:

(i) a support;

(ii) an image forming layer comprising an image forming substance;

(iii) a release layer;

(iv) a photosensitive layer comprising a free radical polymerisable monomer having at least two ethylenically unsaturated groups, a binder, and a photoinitiator, wherein the ratio of the amount by weight of the monomer to the amount by weight of the binder is from about 0.5 to about 4.0; and (v) a transparent cover sheet; and (B) peeling apart said support and said cover sheet whereby, in the unexposed areas, said image forming layer and said release layer adhere to said support thus forming a positive image, whereas in the exposed areas the photopolymerised photosensitive layer, the release layer, and the image forming layer adhere to said cover sheet thus forming a negative image.

17. A process according to claim 16 further comprising the following step (C): curing by means of UV or visible light the parts of the cohesively broken photosensitive layer present on top of said positive image.

18. A process according to claim 16 wherein said image forming substance is a pigment.

19. A process according to claim 18 wherein said pigment is carbon black.

20. A process according to claim 16 wherein said image forming layer has a density (UV) of at least 3.0.

21. A process according to claim 16 wherein said free radical polymerisable monomer is chosen from the group consisting of trimethylolpropane trimethacrylate, ethoxylated trimethylolpropane triacrylate and ethyleneglycol diacrylate.

22. A process according to claim 16 wherein said release layer contains a mixture of polyethylene wax and poly(tetrafluoroethylene).

23. A photosensitive element according to claim 1 further comprising at least one element selected from the group consisting of:

(A) a subbing layer between said support and said image forming layer; and (B) a sensitizer as part of or mixed into said photosensitive layer;

wherein when said element has not yet been exposed to actinic radiation, the cohesive strength of said photosensitive layer is lower than both the adhesive strength between said image forming layer and said support or its subbing layer and the adhesive strength between said photosensitive layer and said cover sheet, whereas, upon exposure to actinic radiation through said cover sheet, the cohesive strength of said photopolymerised photosensitive layer and the adhesive strength of said photopolymerised photosensitive layer to said image forming layer both become higher than the adhesive strength between said image forming layer and said support or its subbing layer thereby creating a cohesive rupture of said photosensitive layer when said support and said cover sheet are peeled apart.

24. A process according to claim 5 wherein said photosensitive element of step (A) further comprises at least one element selected from the groups consisting of:

a subbing layer between said support and said image forming layer; and a sensitizer as part of or mixed into said photosensitive layer;

wherein when said element has not yet been exposed to actinic radiation, the cohesive strength of said photosensitive layer is lower than both the adhesive strength between said image forming layer and said support or its subbing layer and the adhesive strength between said photosensitive layer and said cover sheet, whereas, upon exposure to actinic radiation through said cover sheet, the cohesive strength of said photopolymerised photosensitive layer and the adhesive strength of said photopolymerised photosensitive layer to said image forming layer both become higher than the adhesive strength between said image forming layer and said support or its subbing layer; and wherein step (B) comprises peeling apart said support and said cover sheet whereby, in the unexposed areas, said image forming layer and part of the cohesively broken photosensitive layer adhere to said support or its subbing layer thus forming a positive image, whereas in the exposed areas the photopolymerised photosensitive layer and the image forming layer adhere to said cover sheet thus forming a negative image.

25. A process according to claim 24 further comprising the following step (C): curing by means of UV or visible light the parts of the cohesively broken photosensitive layer present on top of said positive metal image.

26. A photosensitive element according to claim 10 further comprising at least one element selected from the group consisting of:

(A) a subbing layer between said support and said image forming layer; and (B) a sensitizer as part of or mixed into said photosensitive layer.

* * * * *

UNITED STATES PATENT AND TRADEMARK OFFICE
CERTIFICATE OF CORRECTION

PATENT NO. : 5,882,840

DATED : March 16, 1999

INVENTOR(S) : Daems et al.

It is certified that error appears in the above-identified patent and that said Letters Patent is hereby corrected as shown below:

Column 9, formula 9, "$C_2H_4$" should read -- $C_2H_5$ --;

Column 19, compound 3, "$H_3C$" should read -- $H_2C$ --;

Column 19, compound 4, "$CH_2$" should read -- $CH_3$ --;

Column 20, compound 5, "$H_3C$" should read -- $H_2C$ -- .

Signed and Sealed this

Thirteenth Day of June, 2000

Attest:

Q. TODD DICKINSON

*Attesting Officer*  *Director of Patents and Trademarks*